United States Patent
Tsai

(10) Patent No.: US 9,384,843 B2
(45) Date of Patent: Jul. 5, 2016

(54) NONVOLATILE MEMORY HAVING MEMORY ARRAY WITH DIFFERENTIAL CELLS

(71) Applicant: eMemory Technology Inc., Hsin-Chu (TW)

(72) Inventor: Yu-Hsiung Tsai, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 14/743,315

(22) Filed: Jun. 18, 2015

(65) Prior Publication Data

US 2016/0104535 A1 Apr. 14, 2016

Related U.S. Application Data

(60) Provisional application No. 62/062,963, filed on Oct. 13, 2014.

(51) Int. Cl.
| | | |
|---|---|---|
| *G11C 11/34* | (2006.01) | |
| *G11C 16/14* | (2006.01) | |
| *H01L 27/115* | (2006.01) | |
| *G11C 5/06* | (2006.01) | |
| *H01L 29/10* | (2006.01) | |
| *H01L 29/06* | (2006.01) | |
| *G11C 16/08* | (2006.01) | |
| *H01L 27/092* | (2006.01) | |
| *H02M 1/14* | (2006.01) | |
| *G11C 16/04* | (2006.01) | |
| *G11C 16/10* | (2006.01) | |
| *G11C 16/30* | (2006.01) | |
| *G11C 16/26* | (2006.01) | |
| *H02M 3/07* | (2006.01) | |

(52) U.S. Cl.
CPC ............... *G11C 16/14* (2013.01); *G11C 5/063* (2013.01); *G11C 16/0433* (2013.01); *G11C 16/08* (2013.01); *G11C 16/10* (2013.01); *G11C 16/30* (2013.01); *H01L 27/092* (2013.01); *H01L 27/11521* (2013.01); *H01L 27/11526* (2013.01); *H01L 29/0642* (2013.01); *H01L 29/1095* (2013.01); *H02M 1/14* (2013.01); *G11C 16/26* (2013.01); *H02M 3/07* (2013.01)

(58) Field of Classification Search
USPC .................................................. 365/185.29
See application file for complete search history.

(56) References Cited

U.S. PATENT DOCUMENTS

| | | | |
|---|---|---|---|
| 6,950,342 B2 | 9/2005 | Lindhorst et al. | |
| 7,532,495 B2 * | 5/2009 | Youn | G11C 11/5642 365/185.03 |
| 2004/0170056 A1 * | 9/2004 | Shibata | G11C 11/5628 365/185.03 |

* cited by examiner

*Primary Examiner* — Anthan Tran
(74) *Attorney, Agent, or Firm* — WPAT, PC; Justin King

(57) ABSTRACT

A nonvolatile memory includes a memory array. The memory array is connected to m word lines and (2+n) bit line pairs. These bit line pairs include an erase bit line pair, a program bit line pair and n data bit line pairs. Each word line is connected with (2+n) differential cells of a corresponding row. The (2+n) differential cells include an erase flag differential cell, a program flag differential cell and n data differential cells. The erase flag differential cell is connected with the erase bit line pair. The program flag differential cell is connected with the program line pair. The n data differential cells are connected with the data line pairs. The n data differential cells are determined as erased cells or programmed cells according to setting conditions of the erase flag differential cell and the program flag differential cell.

14 Claims, 10 Drawing Sheets

NONVOLATILE MEMORY HAVING MEMORY ARRAY WITH DIFFERENTIAL CELLS

This application claims the benefit of U.S. provisional application Ser. No. 62/062,963, filed Oct. 13, 2014, the subject matter of which is incorporated herein by reference.

FIELD OF THE INVENTION

The present invention relates to a nonvolatile memory, and more particularly to a nonvolatile memory having a memory array with differential cells.

BACKGROUND OF THE INVENTION

A multi-time programming nonvolatile memory (also referred as a MTP memory) has a memory array with plural cells. Generally, each cell has a floating gate transistor. According to the amount of the hot carriers injected into the floating gate of the floating gate transistor, a threshold voltage of the floating gate transistor is changed and a corresponding state of the cell is determined.

FIG. 1 schematically illustrates the threshold voltage distribution curves of a floating gate transistor of a nonvolatile memory in different states. In case that no hot carriers are injected into the floating gate of the floating gate transistor, the threshold voltage of the floating gate transistor is about Vth1. Whereas, in case that the hot carriers are injected into the floating gate of the floating gate transistor, the threshold voltage of the floating gate transistor is about Vth2. Moreover, the state of the floating gate transistor (or the cell) is determined by applying a control voltage Vc to the floating gate transistor and judging whether the floating gate transistor is turned on. The control voltage Vc is in the range between the threshold voltage Vth1 and the threshold voltage Vth2.

For example, the floating gate transistors of the cells are P-type floating gate transistors. After the control voltage Vc is provided to all P-type floating gate transistors, the P-type floating gate transistors with the threshold values higher than the control voltage Vc are turned on and higher cell currents (i.e., on currents) are generated. In addition, the P-type floating gate transistors with the threshold values lower than the control voltage Vc are turned off and lower cell currents (i.e., off currents) are generated. As shown in FIG. 1, the P-type floating gate transistor that is turned off is in an off state, and the P-type floating gate transistor that is turned on is in an on state, when the control voltage Vc is provided to P-type floating gate transistors.

On the other hand, the floating gate transistors of the cells are N-type floating gate transistors. After the control voltage Vc is provided to all N-type floating gate transistors, the N-type floating gate transistors with the threshold values lower than the control voltage Vc are turned on and higher cell currents are generated. In addition, the N-type floating gate transistors with the threshold values higher than the control voltage Vc are turned off and lower cell currents are generated. Consequently, the state of the N-type floating gate transistor can be determined.

Hereinafter, the cells with the P-type floating gate transistors are illustrated as examples. The features of the cells with the N-type floating gate transistors are similar to those of the cells with the P-type floating gate transistors, and are not redundantly described herein.

FIGS. 2A, 2B and 2C are schematic circuit block diagrams illustrating the operations of the conventional MTP nonvolatile memory. As shown in FIG. 2A, the MTP nonvolatile memory comprises a memory array 210 and a sensing circuit 220. The memory array 210 comprises plural cells c11~cmn, which are arranged in an m×n array. Moreover, m word lines WL1~WLm are connected with corresponding m rows of n cells, and n bit lines BL1~BLn are connected with corresponding n columns of m cells. The sensing circuit 220 comprises n sense amplifiers SA1~SAn. The n sense amplifiers SA1~SAn are connected with the n bit lines BL1~BLn, respectively.

While a read action is performed, one of the m word lines WL1~WLm is activated, and a selected row corresponding to the activated word line is determined. The n cells in the selected row generate corresponding cell currents Ic1~Icn. The cell currents Ic1~Icn are transmitted to the n sense amplifiers SA1~SAn through the n bit lines BL1~BLn. According to the magnitudes of the cell currents Ic1~Icn, the n sense amplifiers SA1~SAn determine n storage states of the n cells of the selected row.

For example, the n sense amplifiers SA1~SAn are current comparators. The positive input terminals of the n sense amplifiers SA1~SAn receive a reference current Iref. The negative input terminals of the n sense amplifiers SA1~SAn receive the corresponding cell currents Ic1~Icn from the n bit lines BL1~BLn. The magnitude of the reference current Iref is in the range between the on current Ion and the off current Ioff. Take the first sense amplifier SA1 as an example. In case that the cell is in the off state, the received cell current Ic1 is the off current Ioff. Since the reference current Iref is higher than the off current Ioff, a data signal D1 outputted from the first sense amplifier SA1 is "1", indicating a first storage state of the cell. Whereas, in case that the cell is in the on state, the received cell current Ic1 is the on current Ion. Since the reference current Iref is lower than the on current Ion, the data signal D1 outputted from the first sense amplifier SA1 is "0", indicating a second storage state of the cell.

After an erase action of the MTP nonvolatile memory is performed, the stored data of all cells are erased. Consequently, the hot carriers are ejected from the floating gates of all cells. Under this circumstance, the cells are in the off state. As shown in FIG. 2B, after a sector erase or chip erase, all cells of the memory array 210 are in the off state. The cells in the off state are indicated by solid dots.

After the erase action of the MTP nonvolatile memory is completed, an erase verification process (or a read operation) is performed. During the erase verification process, the sensing circuit 220 sequentially read the storage states of the plural rows of cells. Since the data signals D1~Dn outputted from the sensing circuit 220 for each selected row are all "1", all cells of the memory array 210 are in the first storage state. Under this circumstance, the sensing circuit 220 confirms that the erase action is completed.

After the completion of the erase action is confirmed, a program action is performed on the memory array 210. During the program cycle, the n memory cells in the selected row are selectively programmed to the on state. Generally, the data are written into the memory array 210 in rows. For example, the data amount of one row is 1024 bits. As shown in FIG. 2C, two rows of cells have been programmed. The cells c11~c1n of the first row and the cells c21~c2n of the second row have corresponding states. Since the cells from the third row to the m-th row are in the off state, it means that the cells are not programmed. If desired, the non-programmed cells of the memory array 210 can be programmed.

After the program action is completed, a read action is performed to read the storage states of the cells of the programmed rows. For example, if the word line WL2 is activated, the second row is the selected row. The n cells c21~c2n of the second row generate corresponding cell currents Ic1~Icn. The cell currents Ic1~Icn are transmitted to the n sense amplifiers SA1~SAn through the n bit lines BL1~BLn. According to the magnitudes of the cell currents Ic1~Icn, the n sense amplifiers SA1~SAn determine n storage states of the n cells of the selected row. The cell current Ic1 is the on current Ion. Since the data signal D1 outputted from the first sense amplifier SA1 is "0", the cell c21 has the second storage state. The cell current Ic2 is the off current Ioff. Since the data signal D2 outputted from the second sense amplifier SA2 is "1", the cell c22 has the first storage state. The cell current Ic3 is the off current Ioff. Since the data signal D3 outputted from the third sense amplifier SA3 is "1", the cell c23 has the first storage state. The cell current Ic4 is the on current Ion. Since the data signal D4 outputted from the fourth sense amplifier SA4 is "0", the cell c24 has the second storage state. The cell current Icn is the on current Ion. Since the data signal Dn outputted from the sense amplifier SAn is "0", the cell c2n has the second storage state.

For increasing the reliability of the MTP nonvolatile memory, the memory array is composed of differential cells. FIGS. 3A, 3B and 3C are schematic circuit block diagrams illustrating the operations of a conventional MTP nonvolatile memory having a memory array with differential cells. As shown in FIG. 3A, the MTP nonvolatile memory comprises a memory array 310 and a sensing circuit 320. The memory array 310 comprises plural differential cells c11~cmn, which are arranged in an m×n array.

Moreover, m word lines WL1~WLm are connected with corresponding m rows of n differential cells, and n bit line pairs (BL1, BL1b), (BL2, BL2b), . . . , and (BLn, BLnb) are connected with corresponding n columns of m differential cells. The sensing circuit 320 comprises n sense amplifiers SA1~SAn. The n sense amplifiers SA1~SAn are connected with the n bit line pairs, respectively. The negative input terminals of the n sense amplifiers SA1~SAn are connected with the corresponding bit lines of the n bit line pairs. The positive input terminals of the n sense amplifiers SA1~SAn are connected with the inverted bit lines of the n bit line pairs.

For example, the differential cells c11~cm1 of the first column are connected with the first bit line pair (BL1, BL1b). The bit line BL1 of first bit line pair is connected with the negative terminal of the sense amplifier SA1, and the inverted bit line BL1b of first bit line pair is connected with the positive terminal of the sense amplifier SA1.

While a read action is performed, one of the m word lines WL1~WLm is activated, and a selected row corresponding to the activated word line is determined. The n differential cells in the selected row generate corresponding cell currents (Ic1, Ic1b), (Ic2, Ic2b), . . . , and (Icn, Icnb). These cell currents are transmitted to the n sense amplifiers SA1~SAn through the n bit line pairs. According to the magnitudes of the cell currents, the n sense amplifiers SA1~SAn determine n storage states of the n differential cells of the selected row.

As shown in FIG. 3B, each differential cell of the memory array 310 comprises two sub-cells. The two sub-cells are connected with the corresponding bit line pair. After the program action is completed, the two sub-cells have the complementary states. For example, the first sub-cell is in the on state, the second sub-cell is in the off state. Alternatively, the first sub-cell is in the off state, the second sub-cell is in the on state. As shown in FIG. 3B, the first sub-cell of the differential cell c11 is connected with the bit line BL1, and the second sub-cell of the differential cell c11 is connected with the inverted bit line BL1b. Moreover, the first sub-cell of the differential cell c11 generates the cell current Ic1, and the second sub-cell of the differential cell c11 generates the cell current Ic1b.

After the program action is completed, a read action is performed to read the storage states of the differential cells of each programmed row of the memory array 310. For example, if the word line WL3 is activated, the third row is the selected row. The n differential cells c31~c3n in the third row generate the corresponding cell currents. These cell currents are transmitted to the n sense amplifiers SA1~SAn through the n bit line pairs. According to the magnitudes of the cell currents, the n sense amplifiers SA1~SAn determine n storage states of the n differential cells c31~c3n of the selected row.

As shown in FIG. 3B, the cell current Ic1 is the off current Ioff, and the cell current Ic1b is the on current Ion. Since the cell current Ic1 is lower than the cell current Ic1b, the data signal D1 outputted from the sense amplifier SA1 is "1", indicating the first storage state of the differential cell c31. The cell current Ic2 is the on current Ion, and the cell current Ic2b is the off current Ioff. Since the cell current Ic2 is higher than the cell current Ic2b, the data signal D2 outputted from the sense amplifier SA2 is "0", indicating the second storage state of the differential cell c32. The cell current Ic3 is the on current Ion, and the cell current Ic3b is the off current Ioff. Since the cell current Ic3 is higher than the cell current Ic3b, the data signal D3 outputted from the sense amplifier SA3 is "0", indicating the second storage state of the differential cell c33. The cell current Icn is the on current Ion, and the cell current Icnb is the off current Ioff. Since the cell current Icn is higher than the cell current Icnb, the data signal Dn outputted from the sense amplifier SAn is "0", indicating the second storage state of the differential cell c3n.

After an erase action of the MTP nonvolatile memory is performed, the stored data of all differential cells are erased. Consequently, the hot carriers are ejected from the floating gates of all differential cells. Under this circumstance, the sub-cells of all differential cells are in the off state. As shown in FIG. 3C, all differential cells c11~cmn of the memory array 310 are in the off state after the erase action is completed. The differential cells in the off state are indicated by solid dots.

After the erase action of the MTP nonvolatile memory is completed, as shown in FIG. 3C, the sub-cells of all differential cells are in the off state. Due to the differences between the sub-cells, some of the data signals D1~Dn indicate the first storage state and the others of the data signals D1~Dn indicate the second storage state. Since the sub-cells of all erased differential cells are in the off state, the sense amplifiers SA1~SAn of the sensing circuit 320 cannot make the accurate judgment.

SUMMARY OF THE INVENTION

An object of the present invention provides a nonvolatile memory having a memory array with differential cells. After an erase action of the memory array is completed, a read operation (or an erase verification) process can be performed to determine the storing state of the erased differential cells successfully.

An embodiment of the present invention provides a nonvolatile memory. The nonvolatile memory includes a memory array. The memory array is connected to m word lines and (2+n) bit line pairs. The (2+n) bit line pairs include an erase bit line pair, a program bit line pair and n data bit line pairs. Each of the word lines is connected with (2+n) differential cells of a corresponding row of the memory array. The (2+n) differential cells include an erase flag differential cell, a program flag differential cell and n data differential cells. The erase flag differential cell is connected with the erase bit line pair. The program flag differential cell is connected with the program line pair. The n data differential cells are connected with the corresponding data line pairs. The n data differential cells of the row are determined as erased cells or programmed cells according to setting conditions of the erase flag differential cell and the program flag differential cell of the row.

Another embodiment of the present invention provides a nonvolatile memory. The nonvolatile memory includes a memory array. The memory array is connected to m word lines and (2+y+n) bit line pairs. The (2+y+n) bit line pairs comprise an erase bit line pair, a program bit line pair, y monitoring bit line pairs and n data bit line pairs. Each of the word lines is connected with (2+y+n) differential cells of a corresponding row of the memory array. The (2+y+n) differential cells include an erase flag differential cell, a program flag differential cell, y monitoring differential cells and n data differential cells. The erase flag differential cell is connected with the erase bit line pair. The program flag differential cell is connected with the program line pair. The y monitoring differential cells are connected with the corresponding monitoring bit line pairs. The n data differential cells are connected with the corresponding data line pairs. The n data differential cells of the row are determined as erased cells or programmed cells according to setting conditions of the erase flag differential cell and the program flag differential cell of the row.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
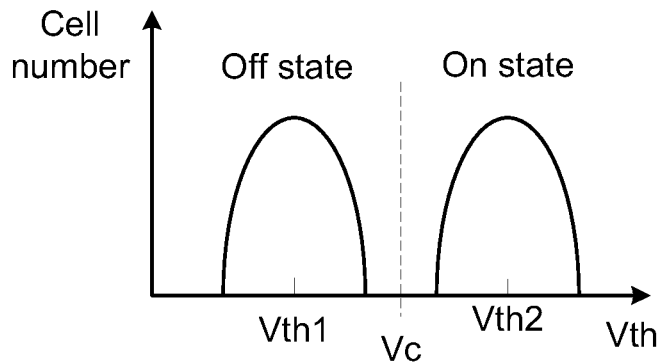
FIG. 1 (prior art) schematically illustrates the threshold voltage distribution curves of a floating gate transistor of a nonvolatile memory in different states.
Figure 2A:
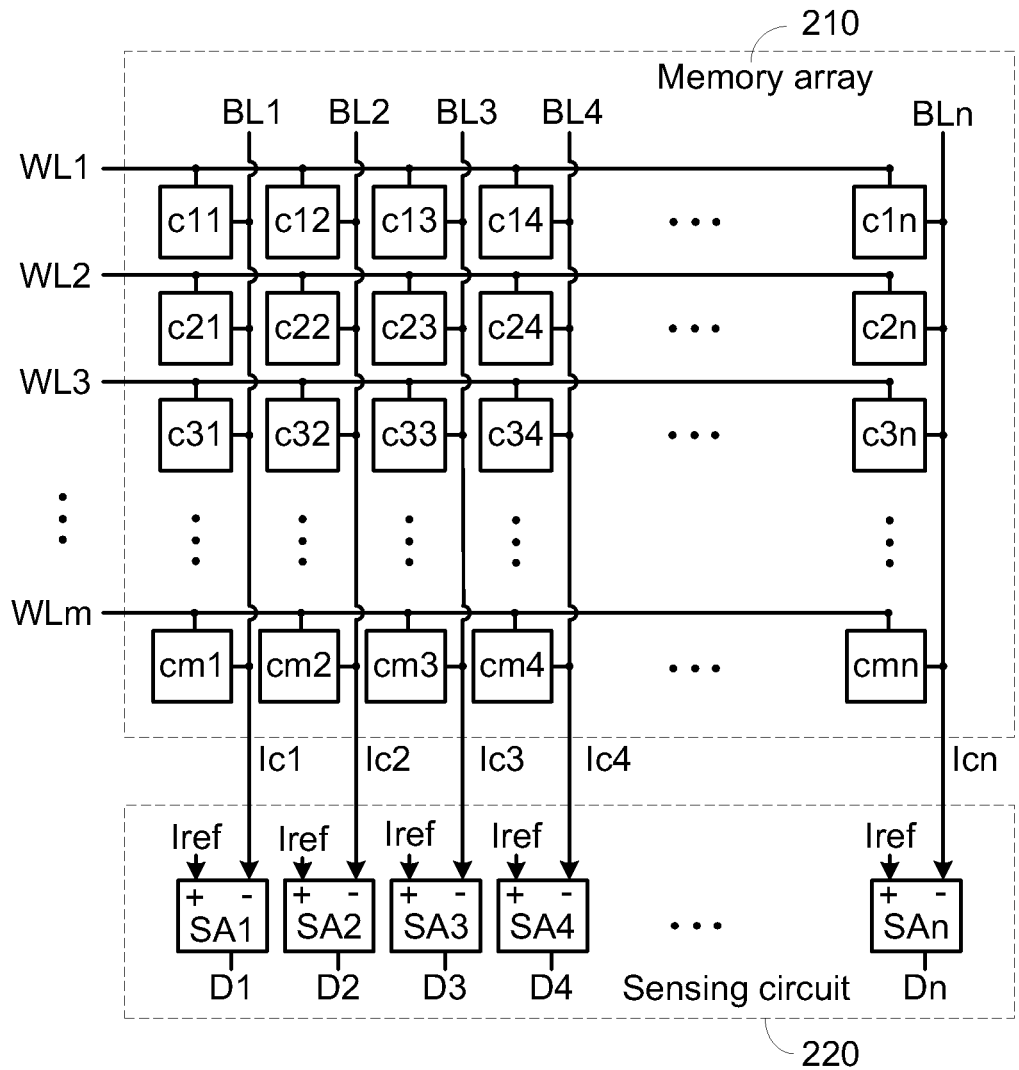
FIGS. 2A, 2B and 2C (prior art) are schematic circuit block diagrams illustrating the operations of the conventional MTP nonvolatile memory.
Figure 2B:
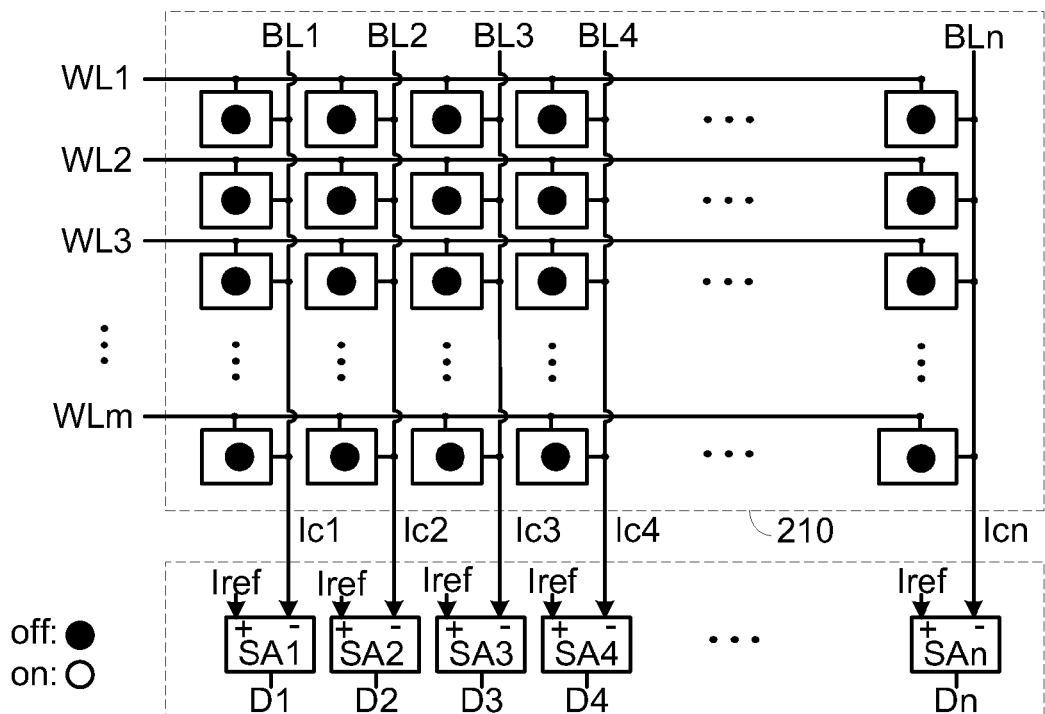
Figure 2C:
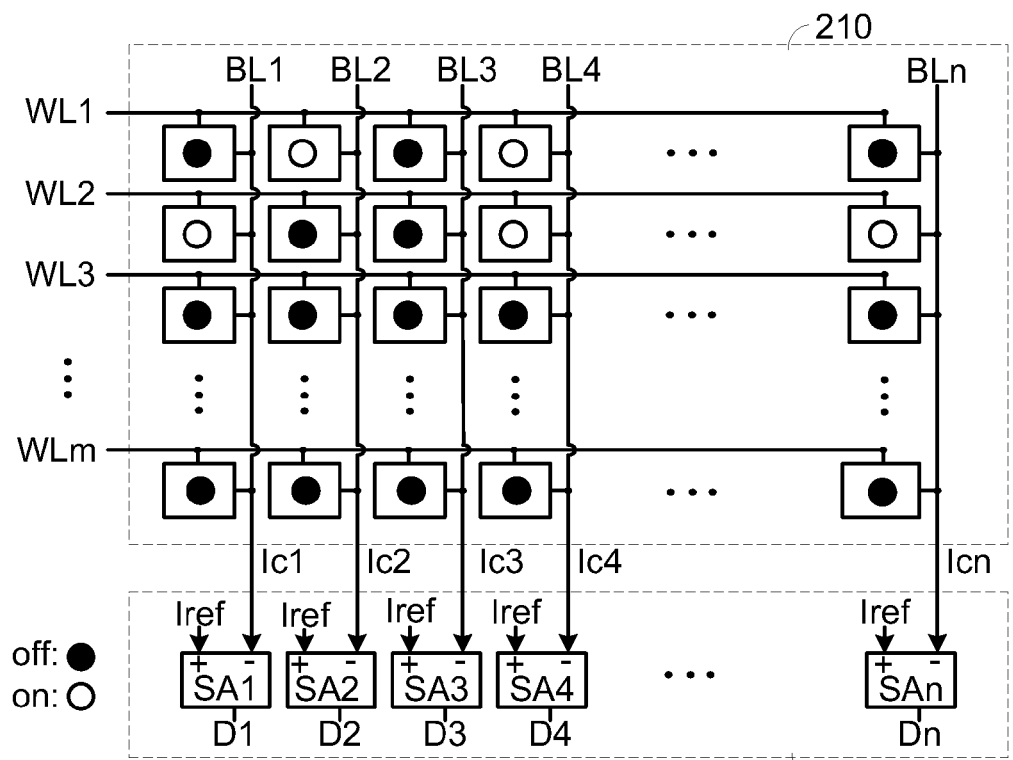
Figure 3A:
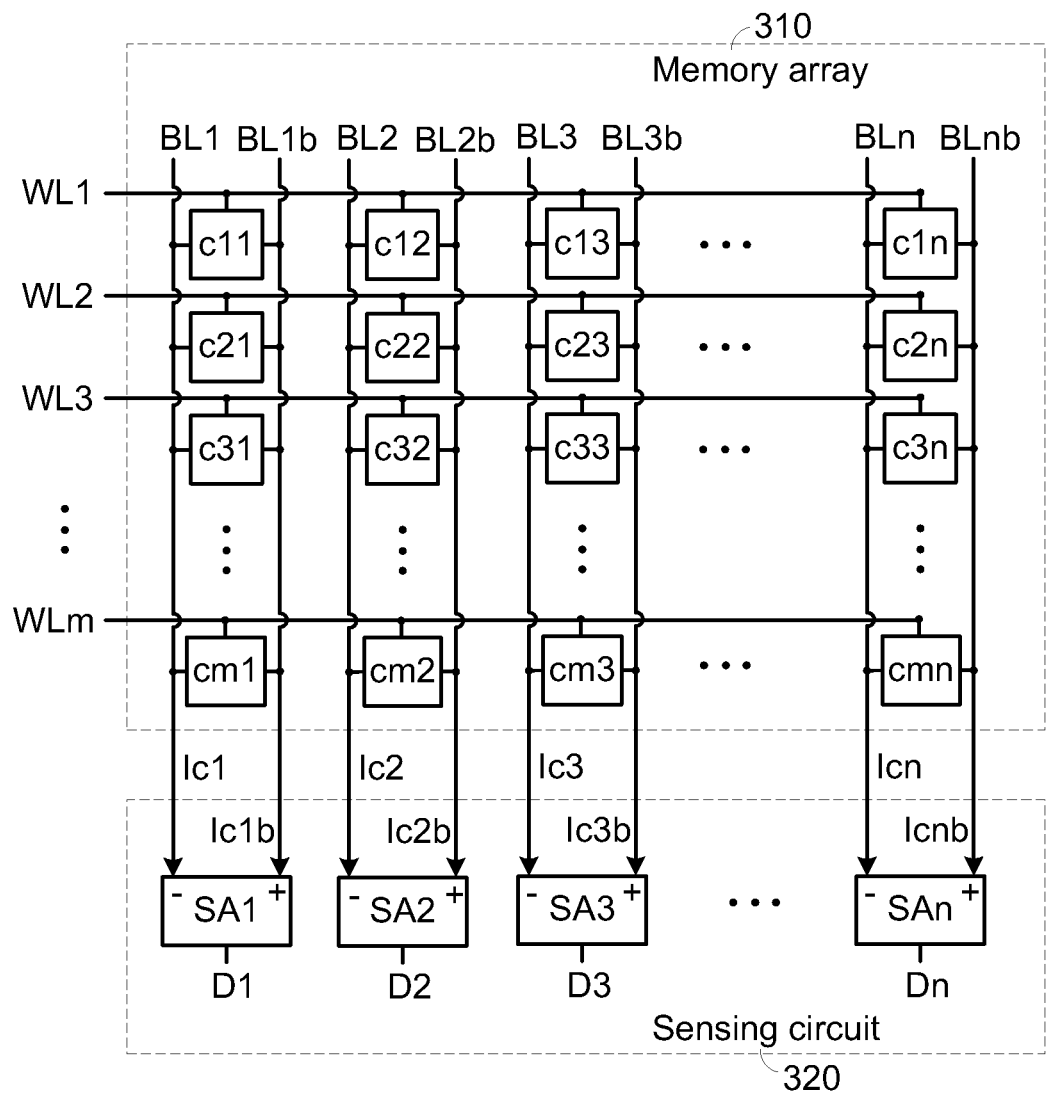
FIGS. 3A, 3B and 3C (prior art) are schematic circuit block diagrams illustrating the operations of a conventional MTP nonvolatile memory having a memory array with differential cells.
Figure 3B:
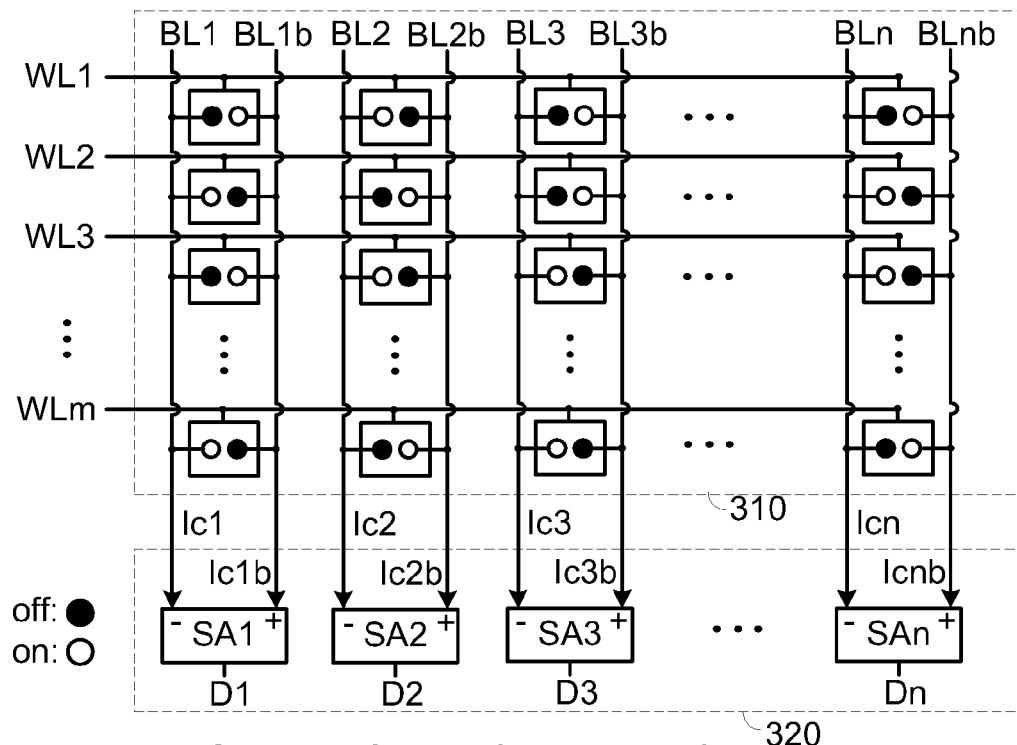
Figure 3C:
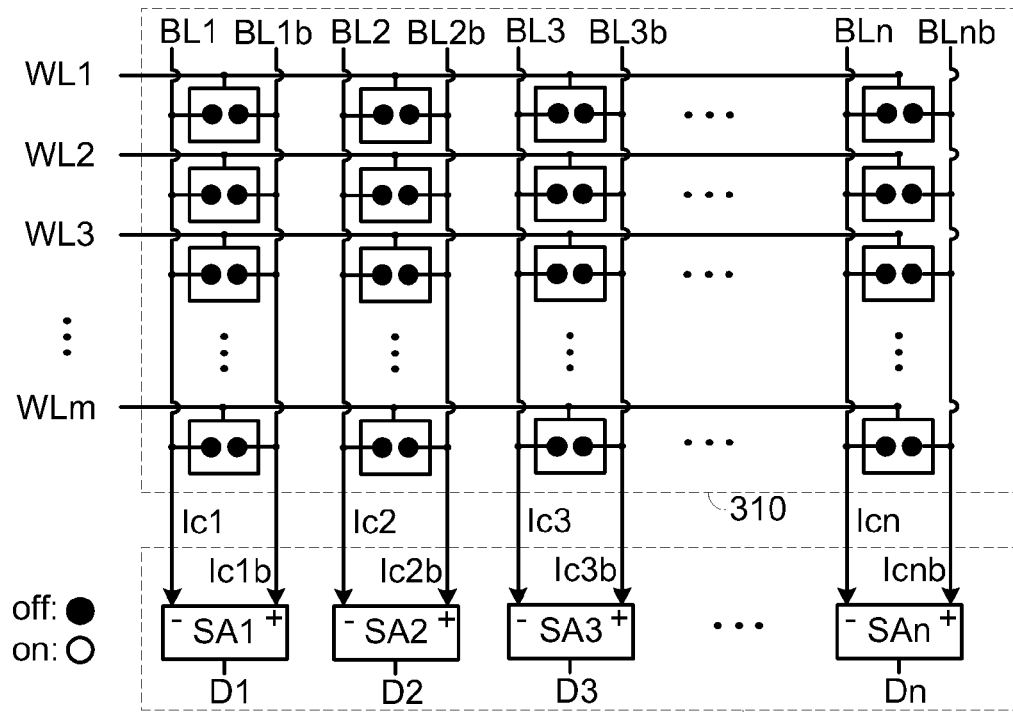
Figure 4:
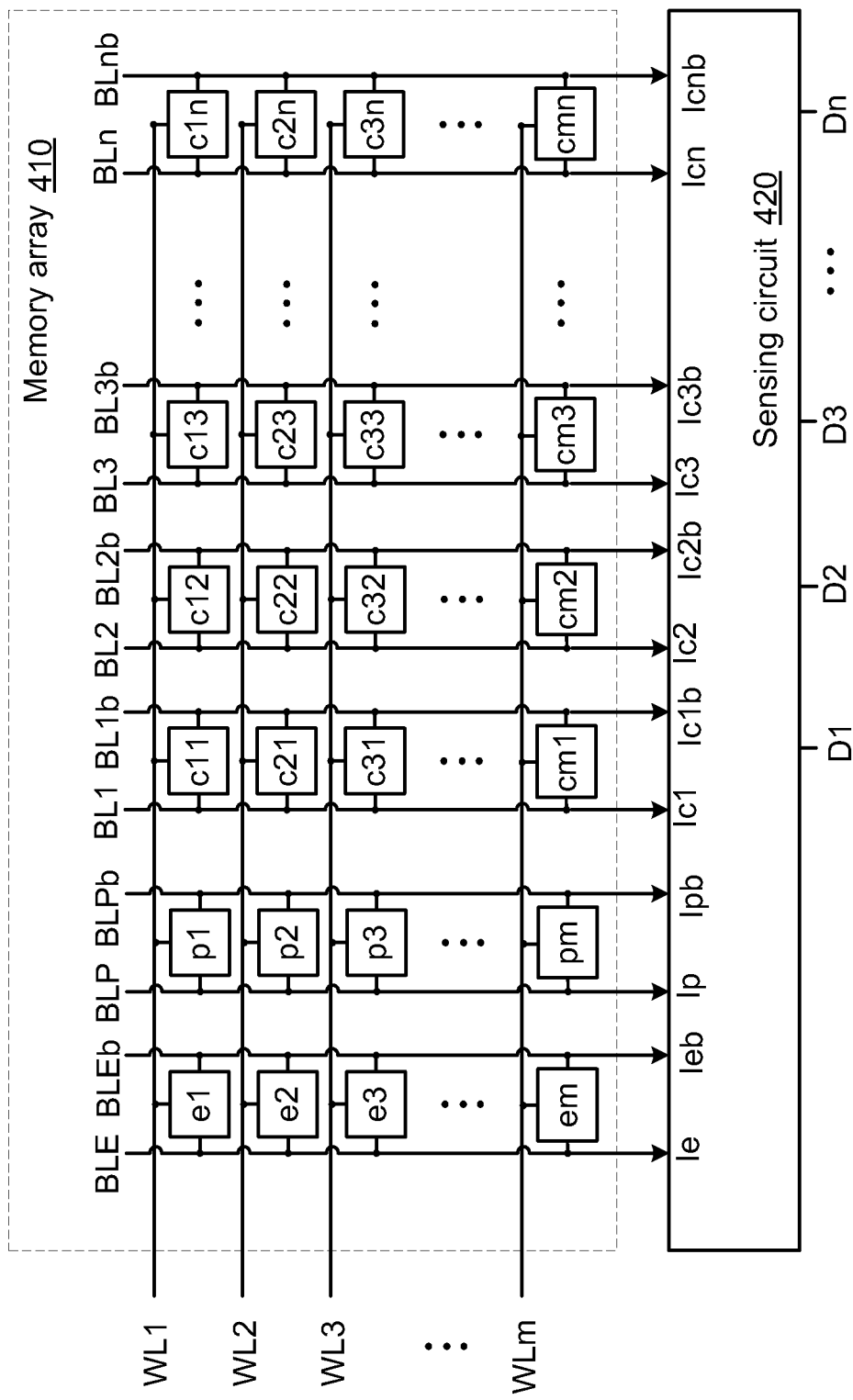
FIG. 4 is a schematic circuit block diagram illustrating a MTP nonvolatile memory according to a first embodiment of the present invention.

FIG. 4 is a schematic circuit block diagram illustrating a MTP nonvolatile memory according to a first embodiment of the present invention. As shown in FIG. 4, the MTP nonvolatile memory comprises a memory array 410 and a sensing circuit 420. The memory array 410 comprises plural differential cells e1~em, p1~pm and c11~cmn, which are arranged in an m×(2+n) array.

Moreover, m word lines WL1~WLm are connected with corresponding m rows of (2+n) differential cells, and (2+n) bit line pairs (BLE, BLEb), (BLP, BLPb), (BL1, BL1$b$), (BL2, BL2$b$), . . . , and (BLn, BLnb) are connected with corresponding (2+n) columns of m differential cells. The sensing circuit 420 is connected with the (2+n) bit line pairs.

Each row of the memory array 410 comprises an erase flag differential cell, a program flag differential cell and n data differential cells. The erase flag differential cell indicates an erase state of the n data differential cells of the row. The program flag differential cell indicates a program state of the n data differential cells of the row.

For example, the (2+n) differential cells of the first row comprise the erase flag differential cell e1, the program flag differential cell p1 and the n data differential cells c11~c1$n$. The erase flag differential cell e1 is connected with the erase bit line pair (BLE, BLEb). The program flag differential cell p1 is connected with the program line pair (BLP, BLPb). The n data differential cells c11~c1$n$ are connected with the data line pairs (BL1, BL1$b$), (BL2, BL2$b$), . . . , and (BLn, BLnb). For example, a first sub-cell of the data differential cell c11 is connected with the data bit line BL1 of the first data bit line pair, and a second sub-cell of the data differential cell c11 is connected with the inverted data bit line BL1$b$ of the first data bit line pair. The first sub-cell of the data differential cell c11 generates a cell current Ic1. The cell current Ic1 is transmitted to the sensing circuit 420 through the data bit line BL1. The second sub-cell of the data differential cell c11 generates a cell current Ic1$b$. The cell current Ic1$b$ is transmitted to the sensing circuit 420 through the inverted data bit line BL1$b$.

The sensing circuit 420 is connected with the (2+n) bit line pairs. According to the cell currents of the erase bit line pair, the sensing circuit 420 determines a selected row as an erased row. Moreover, according to the cell currents of the program line pair, the sensing circuit 420 determines a selected row as a programmed row. If the sensing circuit 420 determines the selected row as the erased row, the n data signals D1~Dn in the first storage state are directly outputted from the sensing circuit 420. Whereas, if the sensing circuit 420 determines the selected row as the programmed row, the n data signals D1~Dn corresponding to the output levels of the n data differential cells of the selected row are outputted from the sensing circuit 420.

Figure 5A:
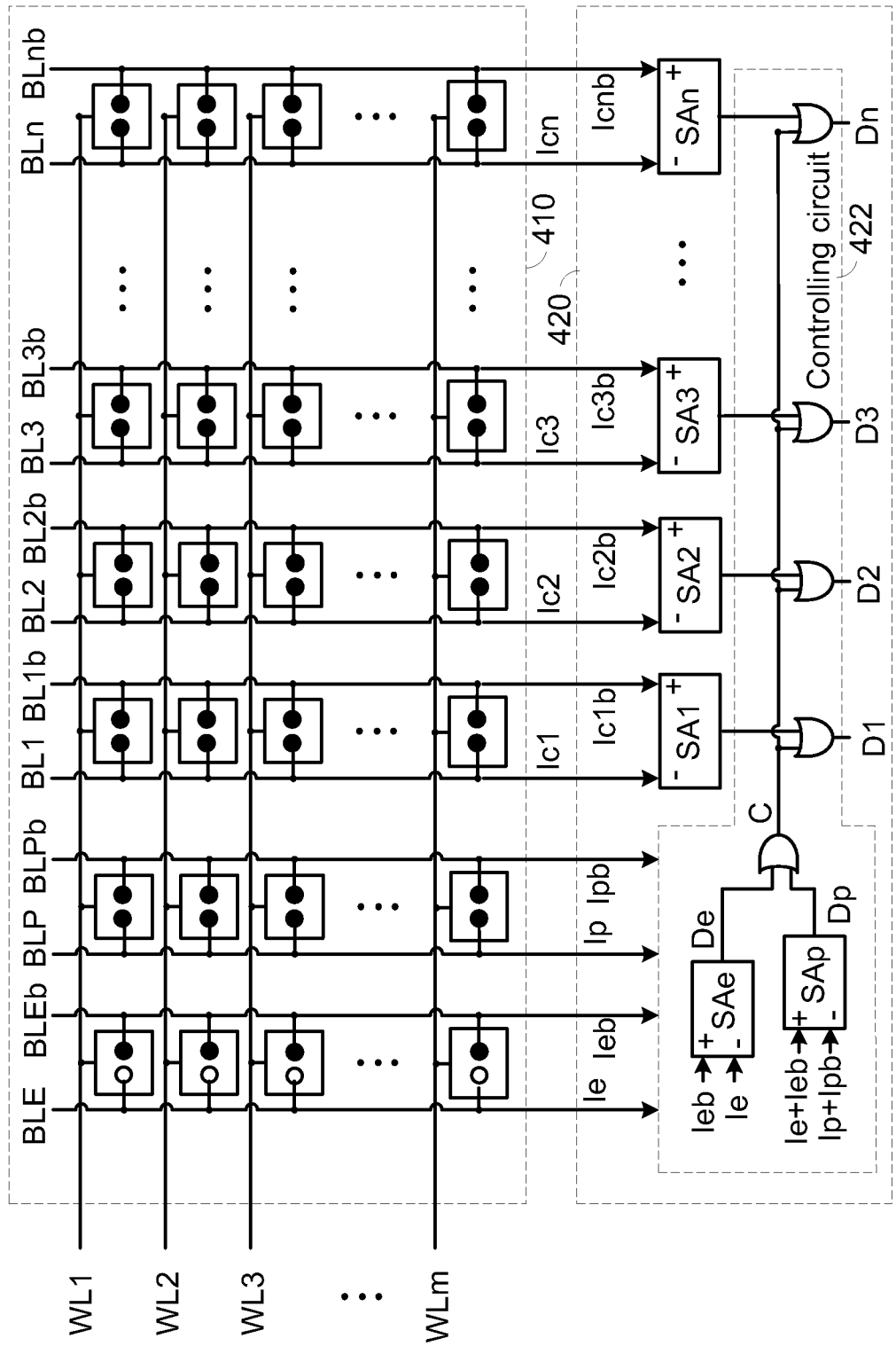
FIG. 5A is a schematic circuit block diagram illustrating the memory array and the sensing circuit of the MTP nonvolatile memory of FIG. 4, in which an erase action is completed.

FIG. 5A is a schematic circuit block diagram illustrating the memory array and the sensing circuit of the MTP nonvolatile memory of FIG. 4, in which an erase action is completed. After a chip erase is completed, the hot carriers are ejected from the floating gates of all differential cells. That is, the stored data of the sub-cells of all differential cells are erased. Then, in accordance with the present invention, the erase flag differential cells e1~em are set after the stored data of all differential cells of the memory array 410 are erased.

The memory array 410 after the erase action is shown in FIG. 5A. In each row of differential cells, only the erase flag differential cell is set, but the sub-cells of the other differential cells are in the off state. For setting the erase flag differential cell, the first sub-cell of the erase flag differential cell is programmed to the on state and the second sub-cell of the erase flag differential cell keeps on the off state.

The sensing circuit 420 comprises n data sense amplifiers SA1~SAn and a controlling circuit 422. The n data sense amplifiers SA1~SAn are connected with the n data bit line pairs, respectively. The negative input terminals of the n data sense amplifiers SA1~SAn are connected with the corresponding bit lines of the n data bit line pairs. The positive input terminals of the n data sense amplifiers SA1~SAn are connected with the inverted bit lines of the n data bit line pairs. The output terminals of the n data sense amplifiers SA1~SAn are connected with the controlling circuit 422.

The controlling circuit 422 comprises a first sense amplifier SAe, a second sense amplifier SAp and plural OR gates. The first sense amplifier SAe receives the two cell currents Ie and Ieb from the erase bit line pair. Moreover, the first sense amplifier SAe judges whether the selected row is the erased row according to the two cell currents Ie and Ieb. The second sense amplifier SAp receives the two cell currents Ie and Ieb from the erase bit line pair and the two cell currents Ip and Ipb from the program line pair. Moreover, the second sense amplifier SAp judges whether the selected row is the programmed row according to the four cell currents Ie, Ieb, Ip and Ipb. The positive input terminal of the first sense amplifier SAe receives the cell current Ieb. The negative input terminal of the first sense amplifier SAe receives the cell current Ie. The output terminal of the first sense amplifier SAe generates a first judging signal De. The positive input terminal of the second sense amplifier SAp receives the sum of the two cell currents Ie and Ieb (i.e., Ie+Ieb). The negative input terminal of the second sense amplifier SAp receives the sum of the two cell currents Ip and Ipb (i.e., Ip+Ipb). The output terminal of the second sense amplifier SAp generates a second judging signal Dp.

For example, in case that the word line WL1 is activated, the first row is the selected row. Meanwhile, the cell current Ie is the on current Ion, the cell current Ieb is the off current Ioff, the cell current Ip is the off current Ioff, and the cell current Ipb is the off current Ioff. Since the cell current Ie is higher than the cell current Ieb, the first judging signal De is the logic level "0". Since the sum of the two cell currents Ie and Ieb is higher than the sum of the two cell currents Ip and Ipb, the second judging signal Dp is the logic level "1". Under this circumstance, a control signal C is the logic level "1". Regardless of the logic levels of the output signals from the data sense amplifiers SA1~SAn, the data signals D1~Dn are all "1" because the control signal C is the logic level "1". Since the data signals D1-Dn are all "1", the data differential cells have the first storage state. After the erase action is completed, an erase verification process (or a read operation) is performed. During the erase verification process, the sensing circuit 420 generates the data signals D1~Dn with the same storage state and confirms that the erase action is successfully done.

Figure 5B:
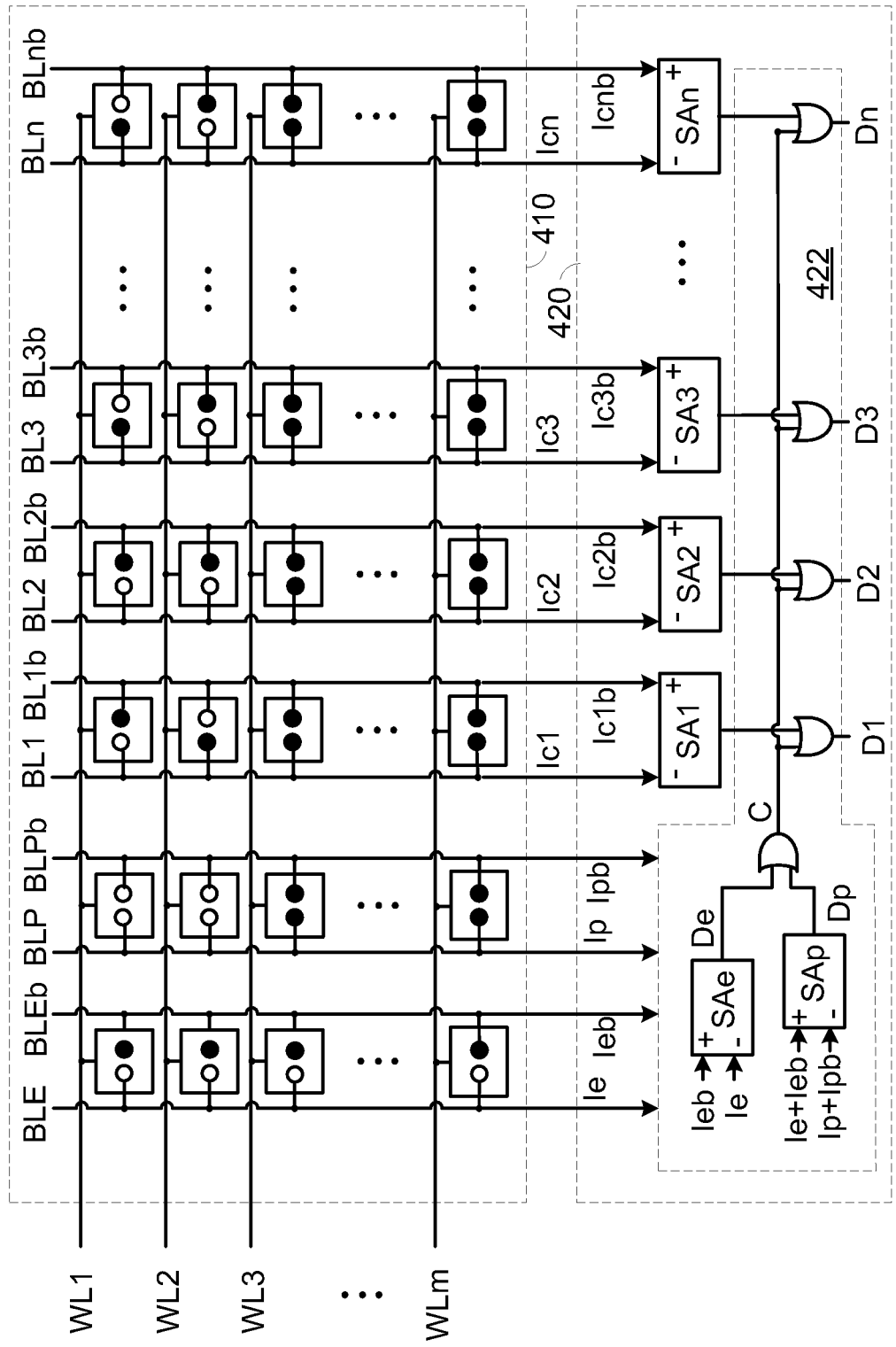
FIG. 5B is a schematic circuit block diagram illustrating the memory array and the sensing circuit of the MTP nonvolatile memory of FIG. 4, in which the first row and the second row are the programmed rows.

FIG. 5B is a schematic circuit block diagram illustrating the memory array and the sensing circuit of the MTP nonvolatile memory of FIG. 4, in which the first row and the second row are the programmed rows. After the program action is performed, the program flag differential cell of the selected row is set to determine the selected row as the programmed row.

Please refer to FIG. 5B. The data differential cells c11~c1n of the first row and the data differential cells c21~c2n of the second row are programmed cells, and the program flag differential cells p1 and p2 are set. The data differential cells of the other rows are non-programmed cells, and the corresponding program flag differential cells p3~pm are not set. For setting the program flag differential cell, both of the first sub-cell and the second sub-cell of the program flag differential cell are programmed to the on state.

For example, in case that the word line WL1 is activated, the first row is the selected row. Meanwhile, the cell current Ie is the on current Ion, the cell current Ieb is the off current Ioff, the cell current Ip is the on current Ion, and the cell current Ipb is the on current Ion. Since the cell current Ie is higher than the cell current Ieb, the first judging signal De is the logic level "0". Since the sum of the two cell currents Ie and Ieb is lower than the sum of the two cell currents Ip and Ipb, the second judging signal Dp is the logic level "0". Under this circumstance, the control signal C is the logic level "0". According to the cell currents of the n data bit line pairs, the data sense amplifiers SA1~SAn generates the corresponding output signals. Since the second judging signal Dp is the logic level "0", the output signals from the data sense amplifiers SA1~SAn are used as the data signals D1~Dn by the controlling circuit 422.

As shown in FIG. 5B, the data signals D1 and D2 outputted from the controlling circuit 422 are "0". That is, the data differential cells c11 and c12 are in the second storage state. The data signals D3 and Dn outputted from the controlling circuit 422 are "1". That is, the data differential cells c13 and c1n are in the first storage state.

From the above descriptions, each row of the memory array 410 additionally comprises an erase flag differential cell and a program flag differential cell. According to the setting conditions of the erase flag differential cell and the program flag differential cell of the selected row, the selected row is determined as an erased row or a programmed row. In case that the selected row is determined as the erased row, the n data differential cells of the selected row have not been programmed yet. In case that the selected row is determined as the programmed row, the n data differential cells of the selected row have been programmed.

As known, the data retention capability of the cell gradually decreases with the increasing storage time period. For example, after the sub-cell is recently programmed to the on state, the magnitude of the on current Ion is the largest. After a time period (e.g., one year), the magnitude of the on current Ion of the sub-cell in the on state gradually decreases. Moreover, as the number of times of performing the erase action increases, the magnitude of the off current of the sub-cell in the off state gradually increases.

In other words, since the data retention capability of the cell gradually decreases or the number of times of performing the erase action increases, the first sense amplifier SAe and the second sense amplifier SAp of the sensing circuit 420 may have misjudgment problems. For solving the misjudgment problems, the erase flag differential cell is reprogrammed and thus reset whenever the program flag differential cell is set. Consequently, the magnitude of the on current Ion is increased.

Figure 6:
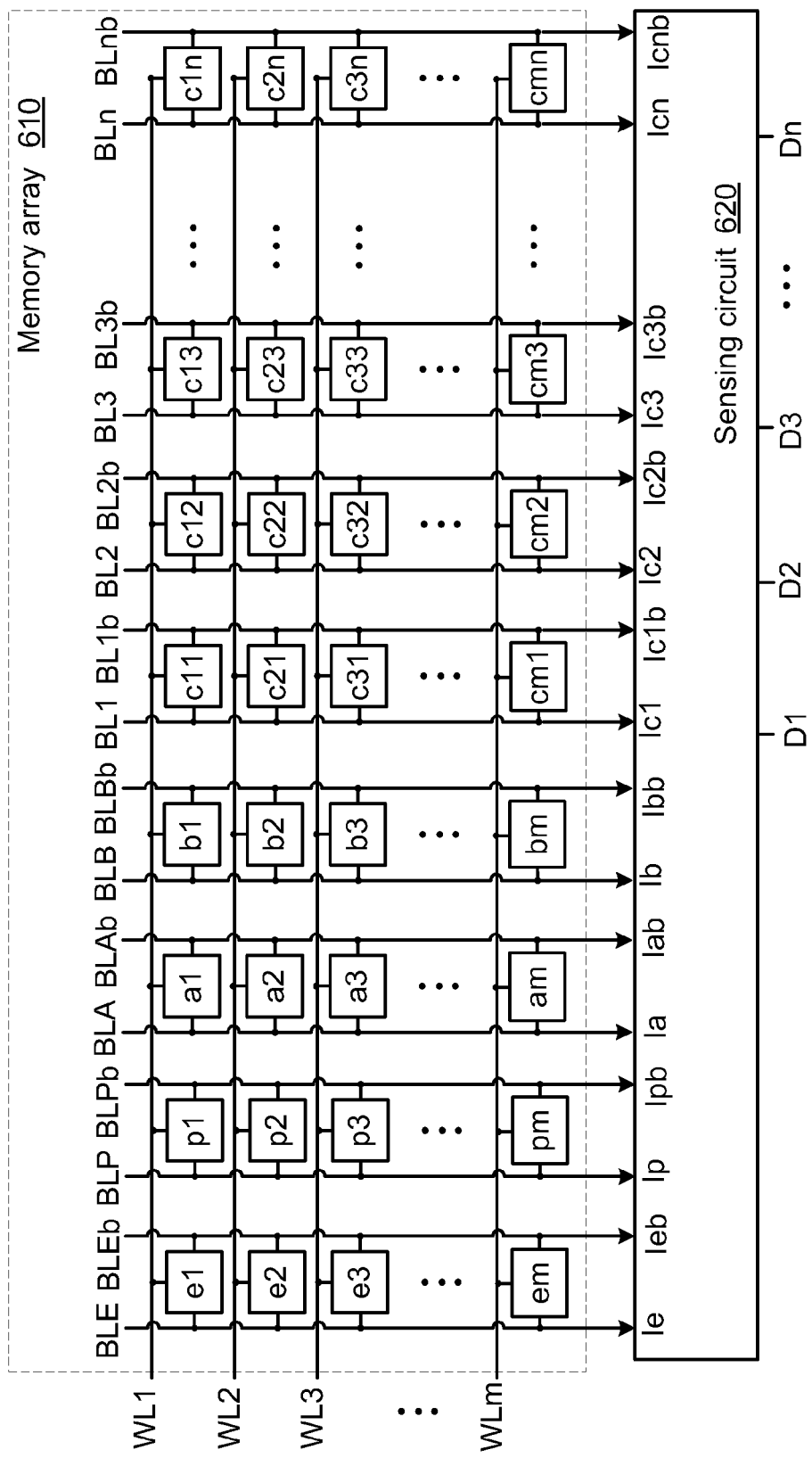
FIG. 6 is a schematic circuit block diagram illustrating a MTP nonvolatile memory according to a second embodiment of the present invention.

FIG. 6 is a schematic circuit block diagram illustrating a MTP nonvolatile memory according to a second embodiment of the present invention. As shown in FIG. 6, the MTP nonvolatile memory comprises a memory array 610 and a sensing circuit 620. The memory array 610 comprises plural differential cells e1~em, p1~pm, a1~am, b1~bm and c11~cmn, which are arranged in an m×(4+n) array. The connecting relationships between these differential cells are not redundantly described herein.

In comparison with the memory array 410 of the first embodiment, the memory array 610 of this embodiment additionally comprises two columns of monitoring differential cells a1~am and b1~bm. The monitoring differential cells a1~am are connected with a first monitoring bit line pair (BLA, BLAB). The monitoring differential cells b1~bm are connected with a second monitoring bit line pair (BLB, BLBb).

In this embodiment, whenever the erase action is performed, the monitoring differential cells a1~am and b1~bm are firstly programmed to the on state and then erased to the off state. As the number of times of erasing the memory array 610 increases, the off currents of the monitoring differential cells a1~am and b1~bm gradually increase. According to the cell currents from the monitoring differential cells a1~am and b1~bm, the sensing circuit 620 judges whether the erase flag differential cell needs to be reprogrammed and reset.

Each row of the memory array 610 comprises an erase flag differential cell, a program flag differential cell, two monitoring differential cells and n data differential cells. The erase flag differential cell indicates an erase state of the n data differential cells of the row. The program flag differential cell indicates a program state of the n data differential cells of the row.

Figure 7A:
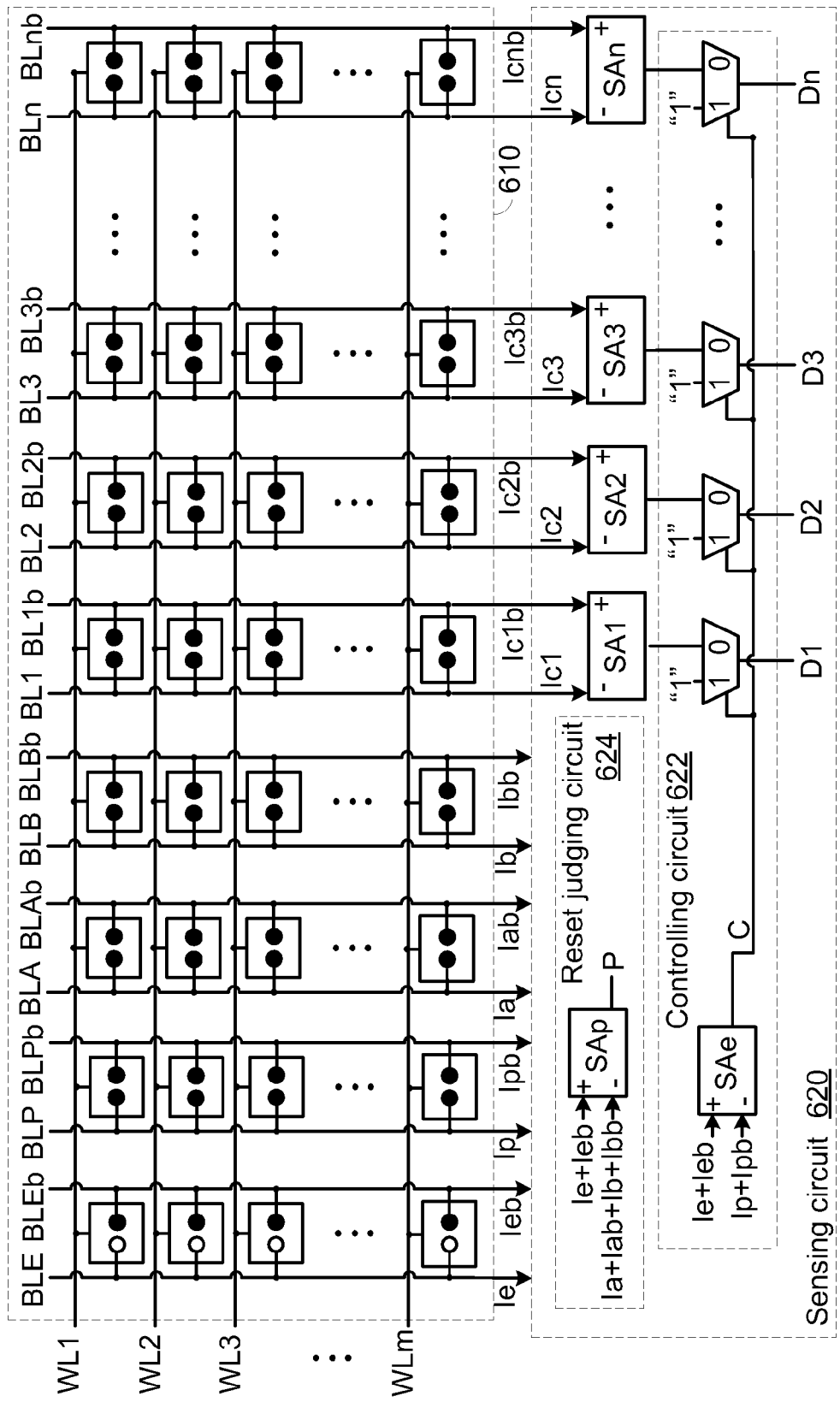
FIG. 7A is a schematic circuit block diagram illustrating the memory array and the sensing circuit of the MTP nonvolatile memory of FIG. 6, in which an erase action is completed.

FIG. 7A is a schematic circuit block diagram illustrating the memory array and the sensing circuit of the MTP non-volatile memory of FIG. 6, in which an erase action is completed. During the erase action, the monitoring differential cells a1~am and b1~bm are firstly programmed to the on state. Then, the monitoring differential cells a1~am and b1~bm and the other differential cells are erased to the off state, thereafter the erase flag differential cells e1~em are set.

The memory array 610 after the erase action is shown in FIG. 7A. In each row of differential cells, only the erase flag differential cell is set, but the sub-cells of the other differential cells are in the off state. For setting the erase flag differential cell, the first sub-cell of the erase flag differential cell is programmed to the on state and the second sub-cell of the erase flag differential cell is programmed to the off state.

The sensing circuit 620 comprises n data sense amplifiers SA1~SAn, a controlling circuit 622 and a reset judging circuit 624. The n data sense amplifiers SA1~SAn are connected with the n data bit line pairs, respectively. The negative input terminals of the n data sense amplifiers SA1~SAn are connected with the corresponding bit lines of the n data bit line pairs. The positive input terminals of the n data sense amplifiers SA1~SAn are connected with the inverted bit lines of the n data bit line pairs. The output terminals of the n data sense amplifiers SA1~SAn are connected with the controlling circuit 622.

The controlling circuit 622 comprises a sense amplifier SAe and plural multiplexers. The sense amplifier SAe receives the two cell currents Ie and Ieb from the erase bit line pair and the two cell currents Ip and 103 from the program line pair. Moreover, the sense amplifier SAe judges whether the selected row is the erased row or the programmed row according to the four cell currents Ie, Ieb, Ip and Ipb. The positive input terminal of the sense amplifier SAe receives the sum of the two cell currents Ie and Ieb (i.e., Ie+Ieb). The negative input terminal of the sense amplifier SAe receives the sum of the two cell currents Ip and 103 (i.e., Ip+Ipb). The output terminal of the sense amplifier SAe generates a control signal C.

The reset judging circuit 624 comprises a sense amplifier SAp. The sense amplifier SAp receives the two cell currents Ie and Ieb from the erase bit line pair, the two cell currents Ia and Iab from the first monitoring bit line pair and the two cell currents Ib and Ibb from the second monitoring bit line pair. Moreover, the sense amplifier SAp judges whether the erase flag differential cells e1~em are reprogrammed and the erase flag differential cells e1~em are reset. The positive input terminal of the sense amplifier SAp receives the sum of the two cell currents Ie and Ieb (i.e., Ie+Ieb). The negative input terminal of the sense amplifier SAp receives the sum of the four cell currents Ia, Iab, Ib and Ibb (i.e., Ia+Iab+Ib+Ibb). The output terminal of the sense amplifier SAp generates a reset signal P. In a normal working state, the sum of the two cell currents Ie and Ieb is higher than the sum of the four cell currents Ia, Iab, Ib and Ibb, and the reset signal P is the logic level "1". In case that the sum of the two cell currents Ie and Ieb is lower than the sum of the four cell currents Ia, Iab, Ib and Ibb, the reset signal P is the logic level "0". Under this circumstance, it is necessary to reprogram the erase flag differential cells e1~em. Consequently, the proper timing of resetting the erase flag differential cells e1~em can be realized according to the reset signal P.

After the erase action is completed, an erase verification process (or read operation) is performed. For example, in case that the word line WL1 is activated, the first row is the selected row. Meanwhile, the cell current Ie is the on current Ion, the cell current Ieb is the off current Ioff, the cell current Ip is the off current Ioff, and the cell current Ipb is the off current Ioff. Since the cell current Ie+Ieb is higher than the cell current Ip+Ipb, the control signal C is the logic level "1". Regardless of the logic levels of the output signals from the data sense amplifiers SA1~SAn, the data signals D1~Dn are all "1" because the control signal C is the logic level "1". Since the data signals D1~Dn are all "1", the data differential cells have the first storage state. After the erase action is completed and while an erase verification process is performed, the sensing circuit 620 generates the data signals D1~Dn with the same storage state and confirms that the erase action is successfully done.

Figure 7B:
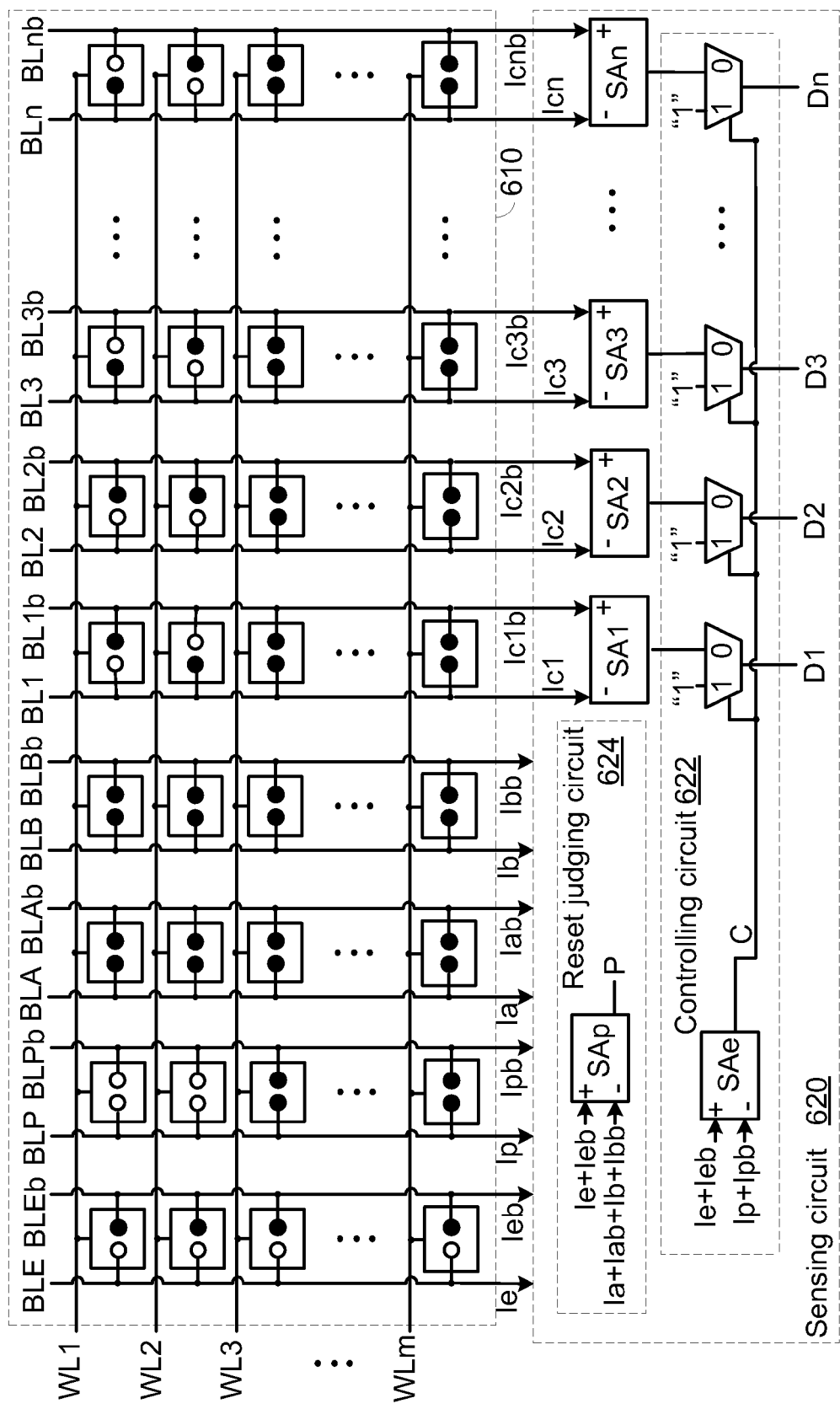
FIG. 7B is a schematic circuit block diagram illustrating the memory array and the sensing circuit of the MTP nonvolatile memory of FIG. 6, in which the first row and the second row are the programmed rows.

FIG. 7B is a schematic circuit block diagram illustrating the memory array and the sensing circuit of the MTP non-volatile memory of FIG. 6, in which the first row and the second row are the programmed rows. After the program action is performed, the program flag differential cell of the selected row is set to determine the selected row as the programmed row.

Please refer to FIG. 7B. The data differential cells c11~c1$n$ of the first row and the data differential cells c21~c2$n$ of the second row are programmed cells, and the program flag differential cells p1 and p2 are set. The data differential cells of the other rows are non-programmed cells, and the corresponding program flag differential cells p3~pm are not set. For setting the program flag differential cell, both of the first sub-cell and the second sub-cell of the program flag differential cell are programmed to the on state.

For example, in case that the word line WL1 is activated, the first row is the selected row. Meanwhile, the cell current Ie is the on current Ion, the cell current Ieb is the off current Ioff, the cell current Ip is the on current Ion, and the cell current Ipb is the on current Ion. Since the sum of the two cell currents Ie and Ieb is lower than the sum of the two cell currents Ip and Ipb, the control signal C is the logic level "0". According to the cell currents of the n data bit line pairs, the data sense amplifiers SA1~SAn generates the corresponding output signals. Since the control signal C is the logic level "0", the output signals from the data sense amplifiers SA1~SAn are used as the data signals D1~Dn by the controlling circuit 622.

As shown in FIG. 7B, the data signals D1 and D2 outputted from the controlling circuit 622 are "0". That is, the data differential cells c11 and c12 are in the second storage state. The data signals D3 and Dn outputted from the controlling circuit 622 are "1". That is, the data differential cells c13 and c1n are in the first storage state.

From the above descriptions, each row of the memory array 610 additionally comprises an erase flag differential cell, a program flag differential cell and two monitoring differential cells. According to the setting conditions of the erase flag differential cell and the program flag differential cell of the selected row, the selected row is determined as an erased row or a programmed row. In case that the selected row is determined as the erased row, the n data differential cells of the selected row have not been programmed. In case that the selected row is determined as the programmed row, the n data differential cells of the selected row have been programmed. Moreover, the timing of reprogramming the erase flag differential cells can be realized according to the cell currents of the monitoring differential cells. Consequently, the possibility of causing the misjudgment problem of the sense amplifier SAe of the sensing circuit 620 will be minimized.

It is noted that numerous modifications and alterations may be made while retaining the teachings of the invention. For example, the ways of setting the erase flag differential cell and the program flag differential cell are not restricted. In some other embodiments, for setting the erase flag differential cell, the first sub-cell keeps on the off state, and the second sub-cell is programmed to the on state.

Moreover, the circuitry configuration of the controlling circuit is not restricted. For example, the controlling circuit 622 of the second embodiment may be applied to the first embodiment while achieving the similar results. Similarly, the controlling circuit 422 of the first embodiment may be applied to the second embodiment while achieving the similar results. Moreover, the circuitry configuration of the controlling circuit may be modified according to the ways of setting the erase flag differential cell and the program flag differential cell.

In the second embodiment, the sum of the four cell currents Ia, Iab, Ib and Ibb (i.e., Ia+Iab+Ib+Ibb) from the monitoring differential cells and the sum of the two cell currents Ie and Ieb (i.e., Ie+Ieb) from the erase flag differential cell are compared with each other by the reset judging circuit 624. In some other embodiments, the sum of x cell currents from the monitoring differential cells and the sum of the two cell currents Ie and Ieb (i.e., Ie+Ieb) from the erase flag differential cell are compared with each other, wherein x is larger than or equal to 3. In other words, the memory array 610 may contain more than two columns of monitoring differential cells.

In the above embodiments, the differential cells with the P-type floating gate transistors are illustrated as examples. The features of the differential cells with the N-type floating gate transistors are similar to those of the differential cells with the P-type floating gate transistors, and are not redundantly described herein.

From the above descriptions, the present invention provides a nonvolatile memory having a memory array with differential cells. After an erase action of the memory array is completed, an erase verification process can be performed to confirm whether the erase action is successfully done.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A nonvolatile memory, comprising:
    a memory array connected to m word lines and (2+n) bit line pairs, wherein the (2+n) bit line pairs comprise an erase bit line pair, a program bit line pair and n data bit line pairs,
    wherein each of the word lines is connected with (2+n) differential cells of a corresponding row of the memory array, wherein the (2+n) differential cells comprise an erase flag differential cell, a program flag differential cell and n data differential cells, wherein the erase flag differential cell is connected with the erase bit line pair, the program flag differential cell is connected with the program line pair, and the n data differential cells are connected with the corresponding data line pairs,
    wherein if the erase flag differential cell of the row is set, the n data differential cells of the row are determined as the erased cells, wherein if the erase flag differential cell and the program flag differential cell of the row are both set, the n data differential cells of the row are determined as the programmed cells.

2. The nonvolatile memory as claimed in claim 1, wherein while the program flag differential cell of the row is set, the erase flag differential cell is reprogrammed, so that the erase flag differential cell is reset.

3. The nonvolatile memory as claimed in claim 1, wherein the nonvolatile memory further comprises a sensing circuit, and the sensing circuit is connected with the (2+n) bit line pairs, wherein the sensing circuit comprises:
    n data sense amplifiers, wherein each of the data sense amplifiers comprises two input terminals and an output terminal, wherein the two input terminals are connected with the corresponding data bit line pair; and
    a controlling circuit connected with the erase bit line pair, the program bit line pair and the output terminals of the n data bit line pairs,
    wherein the controlling circuit determines the n data differential cells of the row as the erased cells or the programmed cells according to four cell currents from the erase bit line pair and the program bit line pair.

4. The nonvolatile memory as claimed in claim 3, wherein if the n data differential cells of the row are the erased cells, the controlling circuit generates n data signals with a first logic level, wherein if the n data differential cells of the row are the programmed cells, n output signals from the n data sense amplifiers are used as the n data signals by the controlling circuit.

5. The nonvolatile memory as claimed in claim 3, wherein the erase flag differential cell of the row comprises a first sub-cell and a second sub-cell, and the program flag differential cell of the row comprises a third sub-cell and a fourth sub-cell, wherein when the erase flag differential cell is set, the first sub-cell is in an on state and the second sub-cell is in an off state, wherein when the program flag differential cell is set, the third sub-cell is in the on state and the fourth sub-cell is in the on state.

6. The nonvolatile memory as claimed in claim 5, wherein the first sub-cell generates a first cell current to the controlling circuit, the second sub-cell generates a second cell current to the controlling circuit, the third sub-cell generates a third cell current to the controlling circuit, and the fourth sub-cell generates a fourth cell current to the controlling circuit, wherein if a sum of the first cell current and the second cell current is higher than a sum of the third cell current and the fourth cell current, the n data differential cells of the row are determined as the erased cells, wherein if the sum of the first cell current and the second cell current is lower than the sum of the third cell current and the fourth cell current, the n data differential cells of the row are determined as the programmed cells.

7. A nonvolatile memory, comprising:
a memory array connected to m word lines and (2+y+n) bit line pairs, wherein the (2+y+n) bit line pairs comprise an erase bit line pair, a program bit line pair, y monitoring bit line pairs and n data bit line pairs; and
a sensing circuit connected with the (2+y+n) bit line pairs,
wherein each of the word lines is connected with (2+y+n) differential cells of a corresponding row of the memory array, wherein the (2+y+n) differential cells comprise an erase flag differential cell, a program flag differential cell, y monitoring differential cells and n data differential cells, wherein the erase flag differential cell is connected with the erase bit line pair, the program flag differential cell is connected with the program line pair, the y monitoring differential cells are connected with the corresponding monitoring bit line pairs, and the n data differential cells are connected with the corresponding data line pairs,
wherein the n data differential cells of the row are determined as erased cells or programmed cells according to setting conditions of the erase flag differential cell and the program flag differential cell of the row,
wherein the y monitoring differential cells are capable of generating monitoring currents to the sensing circuit through corresponding y monitoring bit line pairs, and a timing of reprogramming the erase flag differential cell can be realized according to the monitoring currents.

8. A nonvolatile memory, comprising:
a memory array connected to m word lines and (2+y+n) bit line pairs, wherein the (2+y+n) bit line pairs comprise an erase bit line pair, a program bit line pair, y monitoring bit line pairs and n data bit line pairs,
wherein each of the word lines is connected with (2+y+n) differential cells of a corresponding row of the memory array, wherein the (2+y+n) differential cells comprise an erase flag differential cell, a program flag differential cell, y monitoring differential cells and n data differential cells, wherein the erase flag differential cell is connected with the erase bit line pair, the program flag differential cell is connected with the program line pair, the y monitoring differential cells are connected with the corresponding monitoring bit line pairs, and the n data differential cells are connected with the corresponding data line pairs,
wherein if the erase flag differential cell of the row is set, the n data differential cells of the row are determined as the erased cells, wherein if the erase flag differential cell and the program flag differential cell of the row are both set, the n data differential cells of the row are determined as the programmed cells.

9. The nonvolatile memory as claimed in claim 8, wherein while the program flag differential cell of the row is set, the erase flag differential cell is reprogrammed, so that the erase flag differential cell is reset.

10. A nonvolatile memory, comprising:
a memory array connected to m word lines and (2+y+n) bit line pairs, wherein the (2+y+n) bit line pairs comprise an erase bit line pair, a program bit line pair, y monitoring bit line pairs and n data bit line pairs,
wherein each of the word lines is connected with (2+y+n) differential cells of a corresponding row of the memory array, wherein the (2+y+n) differential cells comprise an erase flag differential cell, a program flag differential cell, y monitoring differential cells and n data differential cells, wherein the erase flag differential cell is connected with the erase bit line pair, the program flag differential cell is connected with the program line pair, the y monitoring differential cells are connected with the corresponding monitoring bit line pairs, and the n data differential cells are connected with the corresponding data line pairs,
wherein the n data differential cells of the row are determined as erased cells or programmed cells according to setting conditions of the erase flag differential cell and the program flag differential cell of the row; and
wherein whenever an erase action is performed, the y monitoring differential cells of the row are firstly programmed to an on state and then erased to an off state.

11. A nonvolatile memory, comprising:
a memory array connected to m word lines and (2+y+n) bit line pairs, wherein the (2+y+n) bit line pairs comprise an erase bit line pair, a program bit line pair, y monitoring bit line pairs and n data bit line pairs; and
a sensing circuit connected with the (2+y+n) bit line pairs,
wherein each of the word lines is connected with (2+y+n) differential cells of a corresponding row of the memory array, wherein the (2+y+n) differential cells comprise an erase flag differential cell, a program flag differential cell, y monitoring differential cells and n data differential cells, wherein the erase flag differential cell is connected with the erase bit line pair, the program flag differential cell is connected with the program line pair, the y monitoring differential cells are connected with the corresponding monitoring bit line pairs, and the n data differential cells are connected with the corresponding data line pairs,
wherein the n data differential cells of the row are determined as erased cells or programmed cells according to setting conditions of the erase flag differential cell and the program flag differential cell of the row,
wherein the sensing circuit comprises:
n data sense amplifiers, wherein each of the data sense amplifiers comprises two input terminals and an output terminal, wherein the two input terminals are connected with the corresponding data bit line pair;
a controlling circuit connected with the erase bit line pair, the program bit line pair and the output terminals of the n data bit line pairs, wherein the controlling circuit determines the n data differential cells of the row as the erased cells or the programmed cells according to four cell currents from the erase bit line pair and the program bit line pair; and
a reset judging circuit connected with the erase bit line pair and the y monitoring bit line pairs, wherein the reset judging circuit judges whether the erase flag differential cell has to be reprogrammed and reset according to two cell currents from the erase bit line pair and 2y cell currents from the y monitoring bit line pairs.

12. The nonvolatile memory as claimed in claim 11, wherein if the n data differential cells of the row are the erased cells, the controlling circuit generates n data signals with a first logic level, wherein if the n data differential cells of the row are the programmed cells, n output signals from the n data sense amplifiers are used as the n data signals by the controlling circuit.

13. The nonvolatile memory as claimed in claim 11, wherein the erase flag differential cell of the row comprises a first sub-cell and a second sub-cell, and the program flag differential cell of the row comprises a third sub-cell and a fourth sub-cell, wherein when the erase flag differential cell is set, the first sub-cell is in an on state and the second sub-cell is in an off state, wherein when the program flag differential cell is set, the third sub-cell is in the on state and the fourth sub-cell is in the on state.

14. The nonvolatile memory as claimed in claim 13, wherein the first sub-cell generates a first cell current to the controlling circuit, the second sub-cell generates a second cell current to the controlling circuit, the third sub-cell generates a third cell current to the controlling circuit, and the fourth sub-cell generates a fourth cell current to the controlling circuit, wherein if a sum of the first cell current and the second cell current is higher than a sum of the third cell current and the fourth cell current, the n data differential cells of the row are determined as the erased cells, wherein if the sum of the first cell current and the second cell current is lower than the sum of the third cell current and the fourth cell current, the n data differential cells of the row are determined as the programmed cells.

* * * * *